United States Patent
Thorpe et al.

(10) Patent No.: US 9,846,413 B2
(45) Date of Patent: *Dec. 19, 2017

(54) SAFETY SHUT-OFF DEVICE AND METHOD OF USE

(71) Applicant: Fire Avert, LLC, Provo, UT (US)

(72) Inventors: Peter Thorpe, Lehi, UT (US); Michael Sanders, Provo, UT (US); Chase Roberts, Provo, UT (US); Kevin Sanders, Springville, UT (US); Zack Bomsta, Provo, UT (US)

(73) Assignee: FIRE AVERT, LLC., Provo, UT (US)

( * ) Notice: Subject to any disclaimer, the term of this patent is extended or adjusted under 35 U.S.C. 154(b) by 646 days.

This patent is subject to a terminal disclaimer.

(21) Appl. No.: 14/482,627

(22) Filed: Sep. 10, 2014

(65) Prior Publication Data

US 2014/0375144 A1    Dec. 25, 2014

Related U.S. Application Data

(63) Continuation-in-part of application No. 13/603,194, filed on Sep. 4, 2012, now Pat. No. 8,836,522.

(Continued)

(51) Int. Cl.
   *G05B 9/02* (2006.01)
   *H03K 17/94* (2006.01)
   (Continued)

(52) U.S. Cl.
   CPC ............. *G05B 9/02* (2013.01); *F23N 5/242* (2013.01); *H02H 3/023* (2013.01); *H03K 17/94* (2013.01);
   (Continued)

(58) Field of Classification Search
   CPC ............. H03K 17/94; G05B 9/02; H02H 3/02
   See application file for complete search history.

(56) References Cited

U.S. PATENT DOCUMENTS 3,666,392 A    5/1972    Julinot
4,072,931 A    2/1978    Davis
(Continued)

FOREIGN PATENT DOCUMENTS

AU    2008203195    2/2010
DE    3237021    5/1983
(Continued)

OTHER PUBLICATIONS

Office Action cited in U.S. Appl. No. 13/603,194 dated Dec. 16, 2013.

(Continued)

*Primary Examiner* — Jeffrey Shin
(74) *Attorney, Agent, or Firm* — Workman Nydegger

(57) ABSTRACT

A safety shut-off system and method are provided for eliminating power to a load in the event of smoke detection. The system may comprise a device located at the appliance for detecting a signal from a smoke detector, and cutting power to the appliance only when the appliance is in use. The device may be synchronized with any standard smoke alarm signal to reduce the number of false positive shut-offs. The system may also comprise a smoke alarm hard-wired to a circuit breaker, for shutting off power to all appliances on a particular breaker upon receipt of a signal from the smoke alarm, and only when the appliances on the breaker are in use. The system may also have the ability to shut off one breaker, multiple breakers, or all breakers at different time increments to actively prevent and reduce the damages caused by fires.

20 Claims, 12 Drawing Sheets

Related U.S. Application Data

(60) Provisional application No. 61/532,188, filed on Sep. 8, 2011, provisional application No. 61/642,998, filed on May 4, 2012.

(51) Int. Cl.
    *H03L 7/00*    (2006.01)
    *F23N 5/24*    (2006.01)
    *H02H 3/02*    (2006.01)
    H02H 1/00      (2006.01)
    H02H 3/33      (2006.01)

(52) U.S. Cl.
    CPC ............ *H03L 7/00* (2013.01); *F23N 2031/00* (2013.01); *H02H 1/0015* (2013.01); *H02H 3/334* (2013.01); *Y10T 307/852* (2015.04)

(56) References Cited

U.S. PATENT DOCUMENTS

| | | |
|---|---|---|
| 4,171,944 A | 10/1979 | Hirschmann |
| 4,659,909 A | 4/1987 | Knutson |
| 5,189,392 A | 2/1993 | Kass |
| 5,300,923 A | 4/1994 | Gruber |
| 5,508,568 A | 4/1996 | Mammen |
| 5,592,032 A | 1/1997 | Keizer et al. |
| 5,625,345 A | 4/1997 | Stark |
| 5,629,824 A | 5/1997 | Rankin |
| 5,670,074 A | 9/1997 | Kass |
| 6,060,994 A | 5/2000 | Chen |
| 6,108,185 A | 8/2000 | Kim |
| 6,141,197 A | 10/2000 | Kim et al. |
| 6,199,573 B1 | 3/2001 | Paskiewicz |
| 6,989,665 B2 | 1/2006 | Goto |
| 7,154,402 B2 | 12/2006 | Dayoub |
| 7,199,721 B2 | 4/2007 | Shirlee |
| 7,327,246 B2 | 2/2008 | Schoor |
| 7,898,427 B1 | 3/2011 | Kim |
| 8,068,034 B2 | 11/2011 | Shah |
| 8,422,184 B2 | 4/2013 | Tsai |
| 8,836,522 B2 * | 9/2014 | Thorpe .................... H02H 3/02 137/38 |
| 2001/0024163 A1 | 9/2001 | Petite |
| 2002/0170595 A1 | 11/2002 | Oliver |
| 2004/0145467 A1 | 7/2004 | Roby |
| 2005/0187596 A1 | 8/2005 | Fiset |
| 2005/0190055 A1 | 9/2005 | Petite |
| 2006/0044133 A1 | 3/2006 | Lou |
| 2006/0170542 A1 | 8/2006 | Schoor |
| 2006/0232431 A1 | 10/2006 | Shirlee |
| 2006/0234617 A1 | 10/2006 | Francis |
| 2006/0267755 A1 | 11/2006 | Albert |
| 2006/0279418 A1 | 12/2006 | Albert |
| 2006/0279419 A1 | 12/2006 | Albert |
| 2007/0096931 A1 | 5/2007 | Runciman |
| 2007/0260797 A1 | 11/2007 | Chen |
| 2007/0290830 A1 | 12/2007 | Gurley |
| 2008/0018484 A1 | 1/2008 | Sager |
| 2008/0100463 A1 | 5/2008 | Shirlee |
| 2009/0207029 A1 | 8/2009 | Shah |
| 2010/0073174 A1 | 3/2010 | Dufour |
| 2010/0090844 A1 | 4/2010 | Shirlee et al. |
| 2010/0263200 A1 | 10/2010 | Kosowsky |
| 2010/0264224 A1 | 10/2010 | Kosowsky |
| 2012/0068556 A1 | 3/2012 | Shah |
| 2012/0195018 A1 | 8/2012 | Kosowsky |
| 2012/0238319 A1 | 9/2012 | Lake |
| 2013/0305608 A1 | 11/2013 | Ersek |

FOREIGN PATENT DOCUMENTS

| | | |
|---|---|---|
| GB | 2474479 | 4/2011 |
| WO | WO2005124711 | 12/2005 |

OTHER PUBLICATIONS

Notice of Allowance cited in U.S. Appl. No. 13/603,194 dated May 15, 2014.

* cited by examiner

SAFETY SHUT-OFF DEVICE AND METHOD OF USE

CROSS-REFERENCE TO RELATED APPLICATIONS

This application is a continuation-in-part of U.S. patent application Ser. No. 13/603,194 entitled "Safety Shut-off Device and Method of Use", filed on Sep. 4, 2012, which application claims priority to U.S. Provisional Patent Application Ser. No. 61/532,188, filed Sep. 8, 2011 and U.S. Provisional Patent Application Ser. No. 61/642,998, filed May 4, 2012, all of which are expressly incorporated by reference herein in their entireties.

BACKGROUND

One of the leading causes of fire in the United States is electrical appliances, and particularly electrical stoves and ranges. While smoke detectors are useful in providing a warning signal after a smoke creating event or a fire has started, they do nothing to minimize the damage caused by the fire. Because appliances can both cause fires and exacerbate existing fires, it is desirable to cut off power to appliances in the smoking stage before a fire begins, or promptly after the fire has commenced. Cutting power to these appliances can potentially reduce the damage caused by smoke and fire, and can conceivably prevent some fires. Appliances such as electrical stoves, ranges, toasters, toaster ovens, electrical griddles and the like, have been known to cause fires. In many cases, a significant amount of smoke is produced before flames appear.

Smoke detectors sense smoke, regardless of whether there are flames present. Fire crews are often called to a "fire" when a fire has not actually started. For example, many times people will leave an item on a stove and forget that the stove has been left on. The item left on the stove will often emit smoke for a prolonged period of time before flames appear which could cause further damage. When firefighters arrive at the home in response to a call from a neighbor or an activated smoke alarm, the firemen often do not know if a fire has actually started unless flames are visible. In many instances, the firemen will force entry by breaking down a door or going through a window only to later find that something has been left on the stove and is smoking, but that no fire has actually started. This can result in hundreds of dollars in needless damage. It can also waste fire crew's time responding to alarms from incidences which could be prevented and diverts them from more serious emergencies. If the power had been interrupted to the appliance, the smoking would have eventually stopped and the response from the firefighters conceivably could have been prevented.

Some patents disclose devices for interrupting power to appliances in the event of a fire, for example, U.S. Pat. No. 5,508,568, U.S. Pat. No. 6,130,412, and U.S. Pat. No. 4,659,909. It is believed that none of the above patents, either taken singly or in combination, have the advantages of the present invention as claimed.

Thus there is a need for an improved device and method which can remove the power from appliances and the like in response to a smoke detector signal to thereby prevent loss of life, prevent property damage from smoke, fire, or other damages incurred in such instances, and to allow firefighters the opportunity to respond to other emergencies. It is further desired that such device and method be simple and easy to install, and include additional safety features for fire prevention and minimization of damages.

BRIEF SUMMARY

It is an object of the present invention to provide a device for use in conjunction with a smoke detector to shut-off one or more appliances, etc. when the smoke detector detects smoke. It is another object of the present invention to provide a method for shutting off appliances, etc. in response to a smoke detector's alarm.

In accordance with the principles of the present invention, a device and method are disclosed which allow appliances, circuit breakers, etc. to be shut-off or tripped in response to signals from the smoke detector.

In accordance with one aspect of the invention, a device may be provided which may be used with existing smoke detectors and requires no professional installation. The device may be plugged into an existing electrical outlet, and any appliance desired to be shut-off at detection of smoke may then be plugged into the device.

In accordance with another aspect of the invention, a device may be provided with a plug that can be plugged into any standard outlet, a unit that detects the smoke detector's signal and shuts-off the appliance plugged into it in response, and an outlet configured to receive a standard appliance plug.

In accordance with another aspect of the invention, a device may be provided which can be easily synchronized with an existing homeowner's smoke detector.

In accordance with another aspect of the invention, a device may be provided which is configured to be integral to a power cord that can be used to replace a standard power cord for an appliance.

In accordance with another aspect of the invention, a device may be provided that can sense the current draw on the battery of a DC-powered smoke detector and send a signal to shut-off power to an appliance, etc. in response to a change in the draw on the battery.

In accordance with another aspect of the invention, a device may be provided that can sense the current draw of an AC-powered smoke detector and shut-off power to an appliance, etc. in response to a change in the current draw.

In accordance with another aspect of the invention, a device may be provided that only cuts power to an appliance if the appliance is on.

In accordance with yet another aspect of the invention, the device may be easily reset when power is cut from the device.

In accordance with another aspect of the present invention, the device may be deployed in a home by simple installation.

In accordance with another aspect of the present invention, the device may be controlled remotely to shut-off appliances by an application on a mobile phone.

In accordance with another aspect of the present invention, means are provided for easily testing the functionality of the device on a regular basis.

In accordance with another aspect of the present invention, the device may cut power to an electric range or a gas range. For example, in the case of a gas range a standard electronic control valve may be used to cut off the gas.

In accordance with another aspect of the present invention, the device may control power or flow in a system such as a pool pump, fire sprinkler, etc., based on status of the system (such as failure which could lead to flooding).

In accordance with another aspect of the present invention, the device may be controlled by an alarm panel as is often installed in home automation or by alarm security companies.

In accordance with another aspect of the present invention, the device may have ports or other methods which make the device easily compatible with such protocols as Zigbee, Zwave, or the like.

In accordance with another aspect of the present invention, the device may be built into the appliance or apparatus to be controlled.

In accordance with another aspect of the present invention, the device may be built to work with standard cooktops, which do not come with a male plug end.

In accordance with another aspect of the present invention, communication from the smoke detector to the device may be accomplished by using a module similar to what is used in the alarm security industry to provide a notification that a smoke detector has gone off.

In accordance with another aspect of the present invention, communication from the smoke detector to the device may be accomplished by providing a specialized smoke detector, to be placed appropriately, which then communicates with the shut-off device.

In accordance with another aspect of the present invention, the device may be reset by providing a separate module.

In accordance with another aspect of the present invention, communication from the smoke detector to the device may be accomplished by providing a specialized smoke detector to be plugged into a nearby outlet which then communicates with the shutoff device over existing power lines.

In accordance with another aspect of the present inventions, the shut-off device may shut off power at the outlet for the appliance, or at the circuit breaker for the appliance.

In accordance with another aspect of the invention, a device may be provided with two timers. The first timer may be used to remove power from an appliance in use after a specific period of time, and the second timer may be used to remove power to a larger area, e.g. the entire floor or the entire house after a specific period of time.

In accordance with another aspect of the present invention, the body of the device may be placed anywhere along the power line from the breaker to the outlet that powers the appliance.

These and other aspects of the present invention may be realized in a devices, systems and methods as shown and described in the following figures and related description.

BRIEF DESCRIPTION OF THE DRAWINGS

Various aspects of the present invention are shown and described in reference to the numbered drawings wherein.

It will be appreciated that the drawings are illustrative of various aspects and embodiments of the present invention and not limiting of the scope of the invention, which is defined by the appended claims. The devices, systems and methods shown accomplish various aspects and objects of the invention, though it is not necessary that any device, system, method or other embodiment accomplish all aspects or any particular aspect of the invention. It is appreciated that it is not possible to clearly show each element and aspect of the invention in a single figure, and as such, multiple figures are presented to separately illustrate various details of the invention in greater clarity. It will be understood that various structures shown in one figure may be used in a device shown in another figure, etc.

DETAILED DESCRIPTION

The invention and accompanying drawings will now be discussed in reference to the numerals provided therein so as to enable one skilled in the art to practice the present invention. The drawings and descriptions are exemplary of various aspects of the invention and are not intended to narrow the scope of the accompanying claims.

Figure 1:
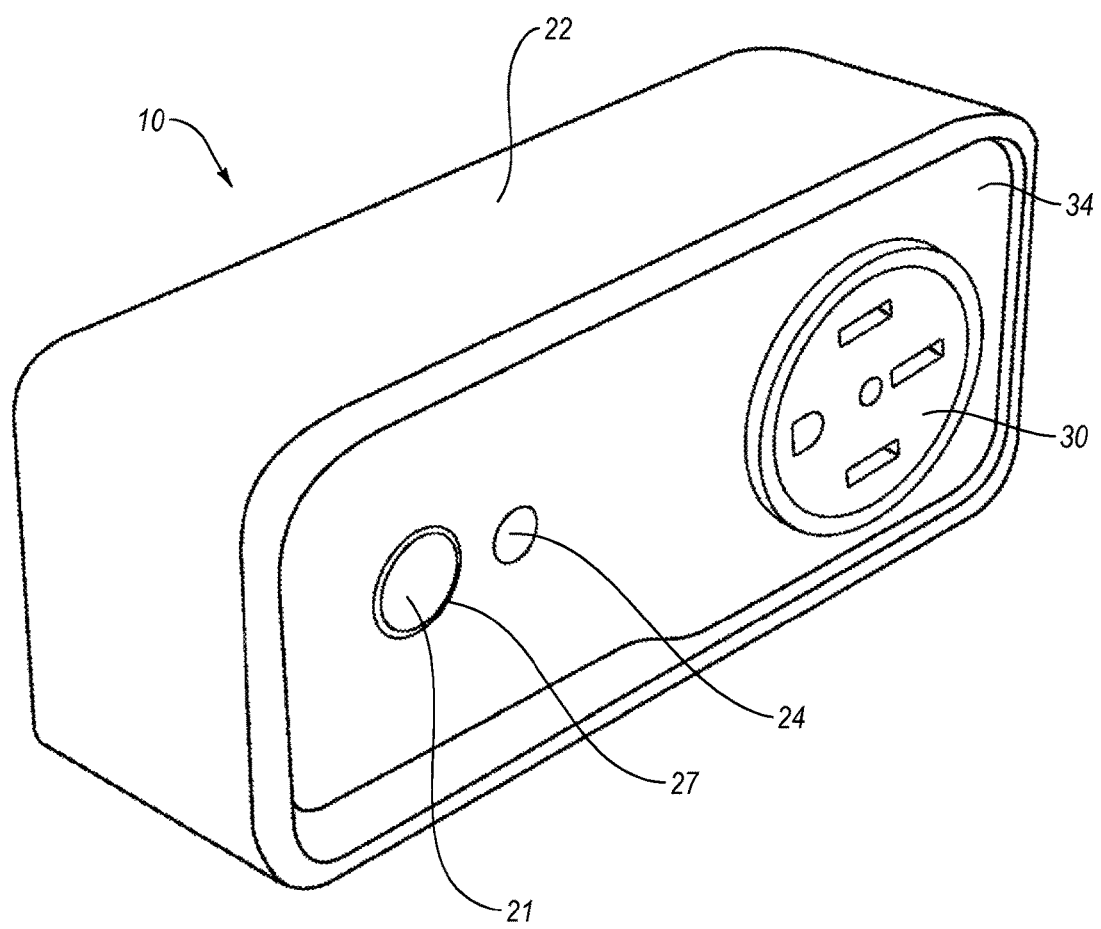
FIG. 1 shows a perspective view of an appliance shut-off device in accordance with principles of the present invention.

FIG. 1 shows a perspective view of an appliance shut-off device, generally indicated at 10, in accordance with principles of the present invention. The device may have a body or housing 22. The front face 34 of the housing may include a pairing button 21, a power indicator LED 24, and a socket 30. The device 10 may be configured to communicate with a standard smoke alarm (not shown in FIG. 1) in a remote location. The communication mechanism between the smoke detector and the shut-off device may be any communication mechanism known in the art, e.g., RF signal, Bluetooth, sound, hardwired, etc. In accordance with one aspect of the invention, the communication occurs by a signal (sound, RF signal, etc.) being transmitted from the smoke detector to an alarm sensor which may be a microphone, RF receiver, Bluetooth receiver, etc. When an alarm signal is received by the alarm sensor, the sensor communicates with a microcontroller or other circuitry (not shown in FIG. 1) which selectively terminates power flow through the device 10, thereby terminating power flow to an appliance or other load connected thereto.

Figure 2:
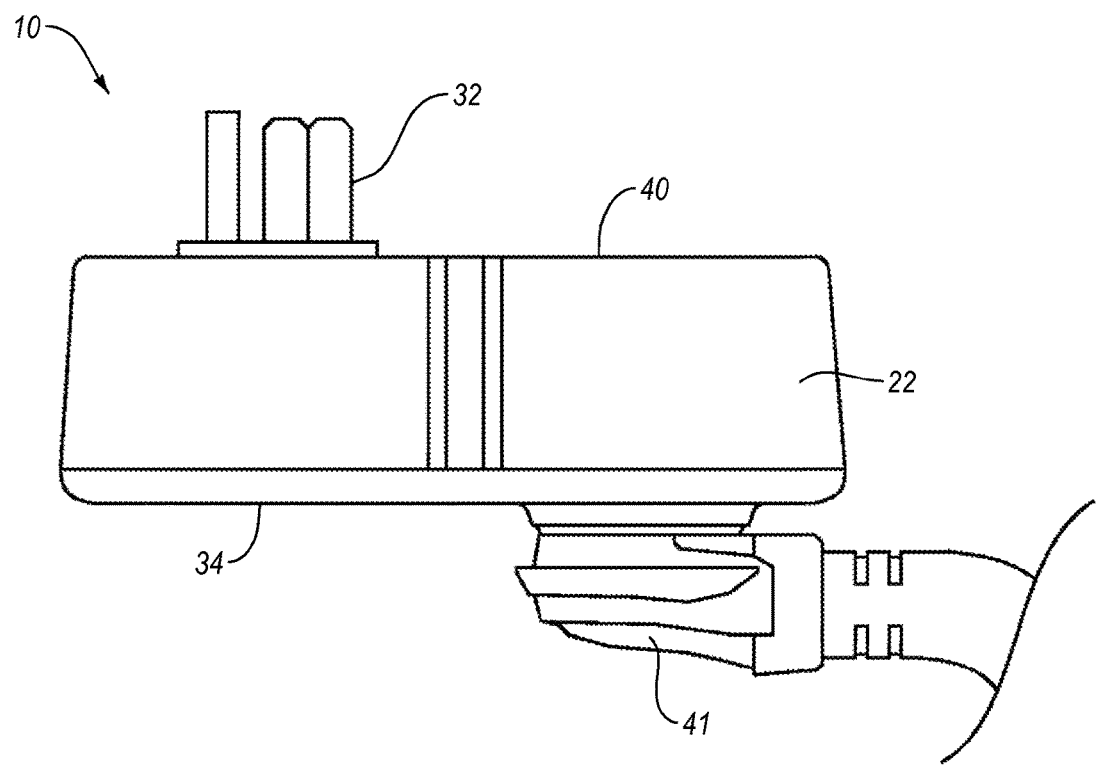
FIG. 2 shows a side view of the appliance shut-off device shown in FIG. 1.

Turning now to FIG. 2, there is shown a side view of the device 10 shown in FIG. 1. The back face 40 of the device housing 22 may include an AC power plug 32. The power plug may be configured to plug into a standard receptacle or a 220V range outlet. As shown in FIG. 2, the power plug 41 of an appliance, etc. has been inserted into the socket 30 on the front face 34 of the device. This side view shows how the device may be configured to be low-profile.

The device 10 generally operates by detecting an alarm signal from a smoke detector, and then cutting power to the load plugged into the device. In other words, the detection of an alarm signal from a smoke detector will cause the device 10 to activate a switch mechanism to thereby terminate power to the power plug 41 of the appliance, etc. One having skill in the art will appreciate that there are numerous ways to carry out this task, and the following illustrations of various embodiments of the device are illustrative, not exhaustive, and are not intended to narrow the scope of the appended claims. Moreover, the term switch mechanism is intended to be broadly read and to cover any mechanism which is used to stop power flow through the device regardless of whether is it technically a switch.

For example, there are numerous ways for the smoke detector to communicate with the shut-off device. In accordance with one aspect of the invention, it may be preferred to use sound as a communication mechanism because it allows the device to be used with smoke detector(s) already present in a home and is non-invasive with respect to the smoke detector. Thus, the device 10 can be made to respond to a particular frequency at which the smoke detector emits its warning sounds. However, the use of sound as a communication mechanism may have the disadvantage of increasing the number of false positive alarms, as sounds other than the alarm may cause the device to trigger. These false alarms may be troublesome for a homeowner who, while using the stove, finds that power has been cut because something else triggered the shut-off device.

One possible configuration of the device 10 (or other devices discussed below) may reduce this problem by synchronizing the device with a particular smoke detector. In FIG. 1, pairing button 21 on the front face 34 of the body of the device 10 is pushed. The user then causes their smoke alarm to sound. Pushing pairing button 21 activates an alarm sensor, such as a microphone (not shown in FIG. 1), which receives the sound of the alarm and calibrates the device 10 to later detect only those frequencies and cadence, or timing, which are heard while the device is in pairing mode. This synchronizes the device with the sound of the particular smoke alarm and reduces false positive alarms (discussed in additional detail below). Additionally, the device 10 may be provided with a pairing indicator light 27. In FIG. 1, the pairing indicator light is shown as a ring of light around the pairing indicator button 21. The pairing indicator light may be configured to only light up, or to display a different color, etc. when the device is successfully paired to a particular alarm sound.

Confirming that the device 10 and the alarm frequency and cadence have been paired is beneficial both in reducing false positives and in ensuring the any change in alarm frequency has been accounted for. For example, if a person purchases a new smoke detector, he or she may pair the new smoke detector with the device to ensure that differences in frequency between the sounds emitted by the old smoke detector and the new smoke detector do not prevent the device for functioning properly.

Figure 3:
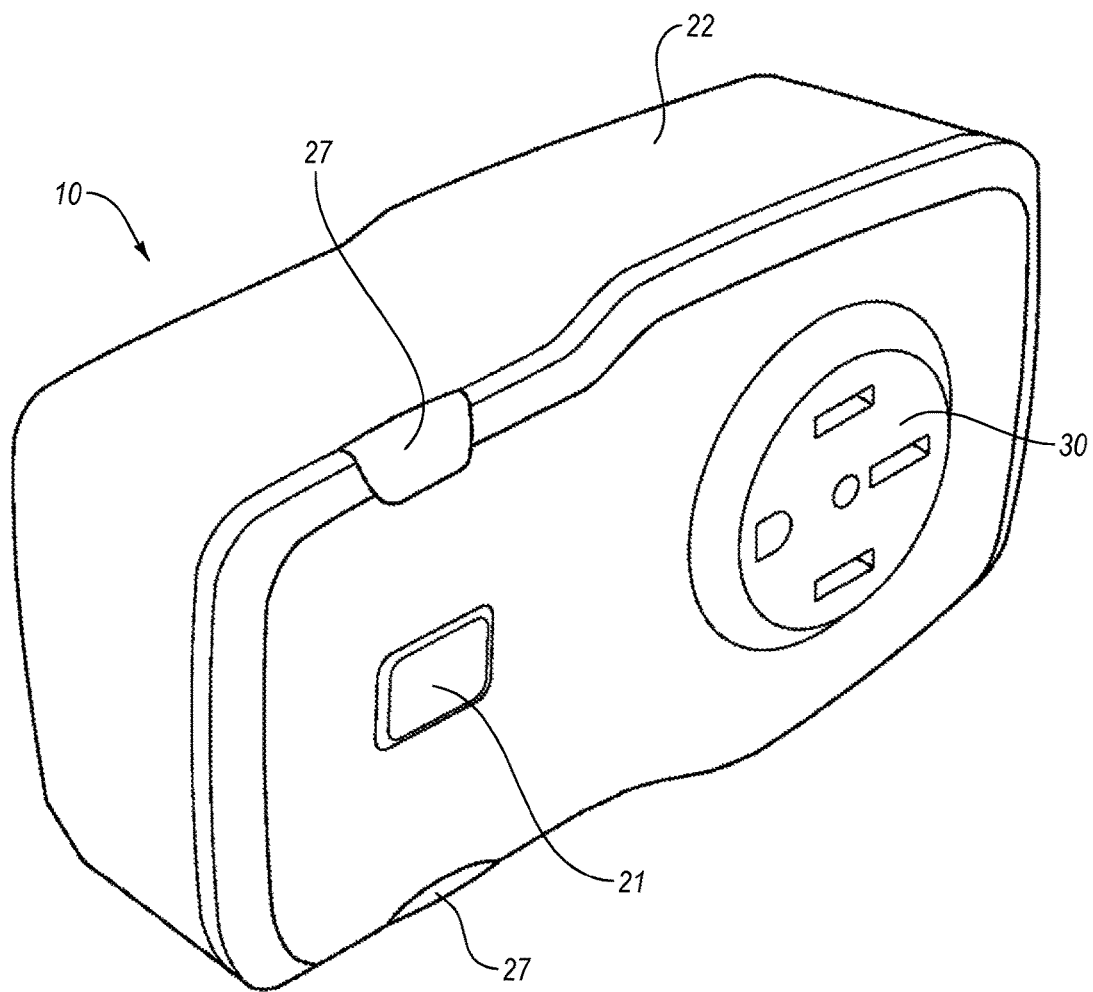
FIG. 3 shows perspective view of an appliance shut-off device in accordance with principles of the present invention.

Turning now to FIG. 3, there is shown another configuration of the device 10 that removes power in the event of a signal from a smoke detector. In this configuration, the front face 34 of the device 10 is equipped with two pairing indicator lights 27, allowing the lights to be viewed independent of which direction the device is facing. Thus, a person could reach in and press the pairing indicator button 21 and observe once the pair has confirmed without having to be able to see the front face 34 of the device 10. This may me particularly beneficial if the device 10 is already in place behind a range, etc. Likewise, the pairing indicator button 21 could be replaced with 2 or more buttons to make them more accessible.

Figure 4:
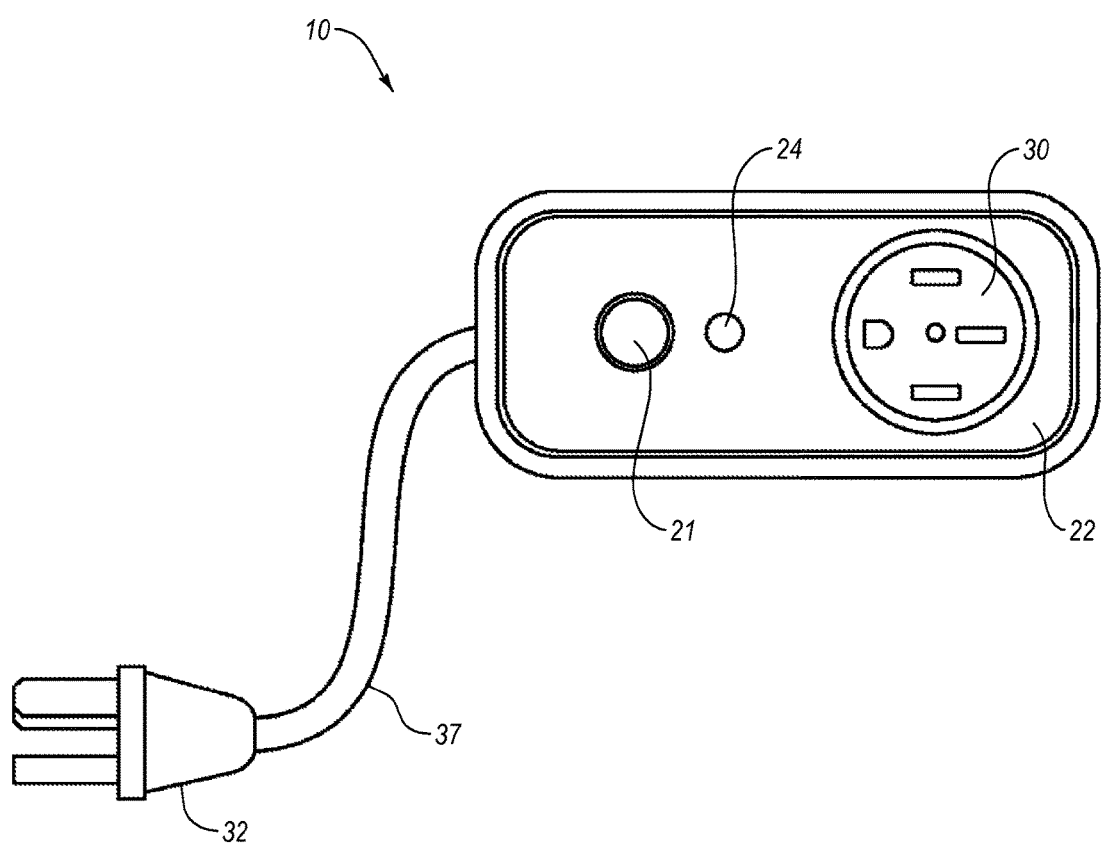
FIG. 4 shows a top view of an appliance shut-off device in accordance with principles of the present invention.

Turning now to FIG. 4, there is shown another illustrative example of a shut-off device 10 in accordance with principles of the present invention. As shown in FIG. 4, the body 22 of the device 10 may also be located at the end of a small length of cord 37 provided with a power plug 32. The body of the device 10 may be placed anywhere along the cord 37, and the length of cord 37 allows for convenient placement of the body wherever there is room between the wall and the appliance, or adjacent the appliance. At the opposite end of the length of cord from the device, power plug 32 may be provided for plugging into a standard receptacle. This configuration of the device is similar to the device shown in FIG. 1, and may also include one or more socket(s) 30 configured for receiving a standard plug or a 220V range plug, and a pairing button 21 for synchronization. It also may be advantageous to configure the length of cord 37 to be removable, such that a user can buy the unit without the extra cord, and plug the extra cord in to act as an extension, if needed. This may provide a significant cost savings to those who do not need the extra cord length.

Figure 5:
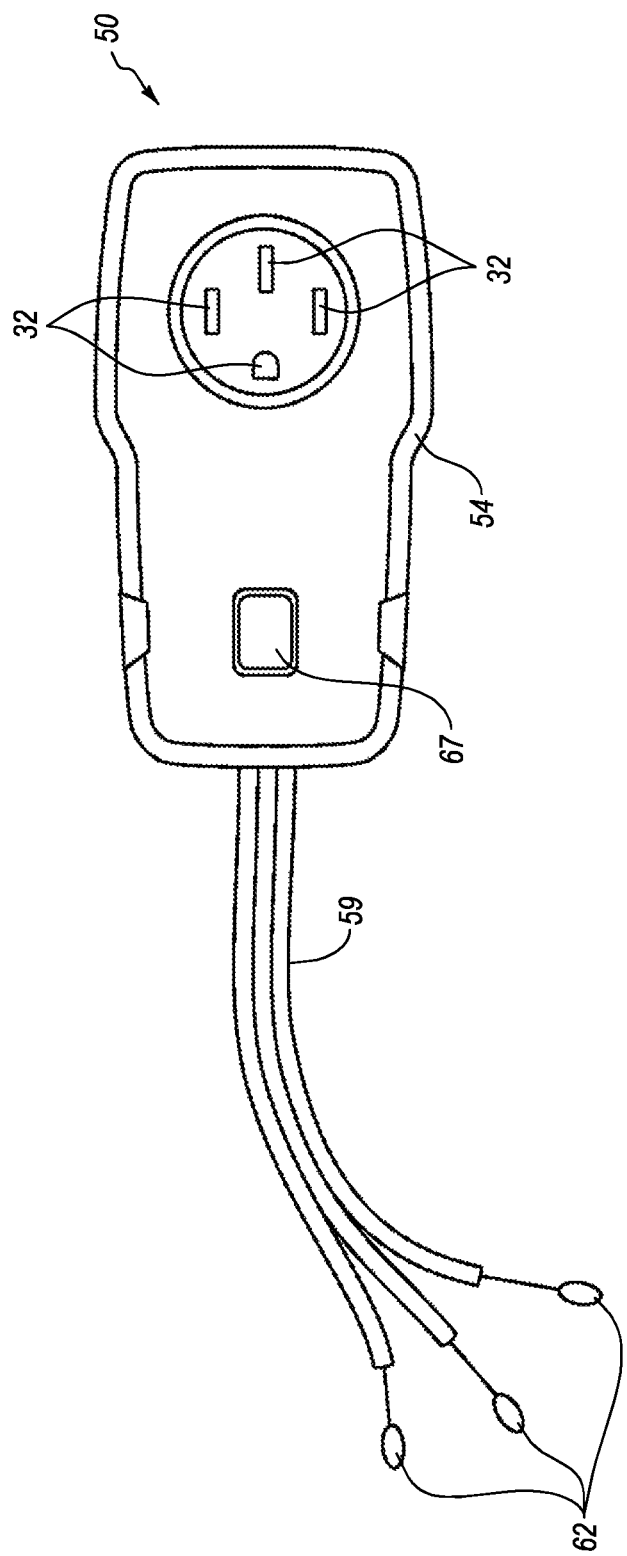
FIG. 5 shows a top view of an appliance shut-off device in accordance with principles of the present invention.

One having skill in the art will appreciate that many configurations are possible and various changes can be made without departing from the scope of the present invention. By way of example, FIG. 5 shows a top view of a shut-off device, generally indicated at 50, made in accordance with the principles of the present invention. In this embodiment, the shut-off device 50 comprises a replacement power cord for an appliance, such as a stove, range, etc. The shut-off device 50 may include a body, or housing 54, located along or at the end of a power cord 59. Such a configuration has the advantage of being simple and easy to install, as stoves often have power cords sold separately and the device may be attached directly to the appliance. The device 50 may be installed by removing the cover plate at the back of the range, removing the terminal wire nuts, and connecting the three ends 62 of the new power cord 59. The body 54 of the device 50 may have a power plug 32. The body 54 of the device 50 may have the same features as described above, such as an alarm sensor (e.g. microphone for detecting the sounds of a smoke alarm), and a pairing button 67 for synchronizing the microphone with the sound of the smoke alarm. Another possible configuration of the shut-off device is to include the current-detecting sensor, communication means, and micro-controller within a specialized outlet as is similarly done in a GFCI outlet. This outlet could be configured to replace standard outlets, and any appliance to be shut-off if a smoke alarm goes off could be plugged into the specialized outlet.

Rather than providing a replacement cord for an appliance or apparatus, the device according to the present invention may also be built integral to the appliance or apparatus which is to be controlled. Additionally, the device may be built to work with cooktops, which do not come with a male plug end. This may be accomplished by providing or recommending a male plug end to be wired to the cooktop which could then be plugged into the device. Another method could be to provide a port or contacts on the device to which the wires from the cooktop could be inserted and secured.

In order for the present invention to properly cut power to an appliance/load in the event of an alarm, it must be functioning properly. Because of the nature of emergencies such as fires, it is important for the device to have high fidelity and a means to test the fidelity thereof. According to the present invention, there are several ways to easily test the functionality of the device on a regular basis. One method is simply to trigger the device under its normal alarm conditions, as is described throughout this application. For example, when an appliance/load is "on," smoke sets off a smoke detector, and the detector continues to sound for a sufficiently long period of time. After receiving this signal for the appropriate amount of time, the device 10/50 activates and the power to the appliance/load is cut. In accordance with some applications of the present invention, the device 10 may be designed to cut power any time the alarm is detected. In other versions, the device only terminates power if the load is drawing power over some predetermined threshold as detected by a current sensor. In other words, a fire alarm set off by a person smoking or a false alarm due to a shower, etc., does not cut power to the stove, etc., if the stove was not being used at the time.

Another method to test the functionality of the device occurs by the user manually setting off their smoke detector, using the test button provided on standard smoke detectors, in a repeated and predictable pattern. The device may be configured to see this repeated and predictable pattern as the proper input to cut power to the load. For example, the user would simply hold the test button on for a set period of time, off for a set period of time, on for a set period of time, and off for a set period of time. By predetermining the set periods of time and programming the shut-off device accordingly, the shut-off device would see this repeated and predictable pattern as an input to cut the power to the load. By way of example and not to be limiting, the user may hold the test button on for 6 seconds, off for 3 seconds, on for 6 seconds, off for 3 seconds, etc.

Other methods for making the user aware of proper function are to have a visual output (such as a light illuminating) when the device is functioning properly. In FIG. 1, this is indicated by the power indicator light 24. Conversely, the light could illuminate when the device is no longer functioning properly. Another method would be to have an auditory output, a chirp for example, which would alert the user of the functioning or non-functioning state of the device, for example, if the device was synced or not to a particular smoke detector. Additionally, it could be desirable to mandate that the device be replaced at certain intervals, as is recommended for smoke detectors. Furthermore, the ability to cut power could be tested by using a mobile phone application to activate the device and cut power.

The body of the device 10, 50 may house a mechanism for detecting a smoke alarm signal. The mechanism will depend on what type of signal the device is configured to receive, for example, sound, RF, Bluetooth, etc. If sound is to be used, the body of the device may house a microphone or other sound/frequency detector for picking up the sounds of the smoke detector. This may be located on the body, or within the body. It may be desirable to have a hidden microphone, such as the embodiment in FIGS. 1-5. One having skill in the art will appreciate that mechanisms other than a microphone could be used for communication between the device and the smoke detector, for example RF, Bluetooth, hard wiring, etc.

Figure 6:
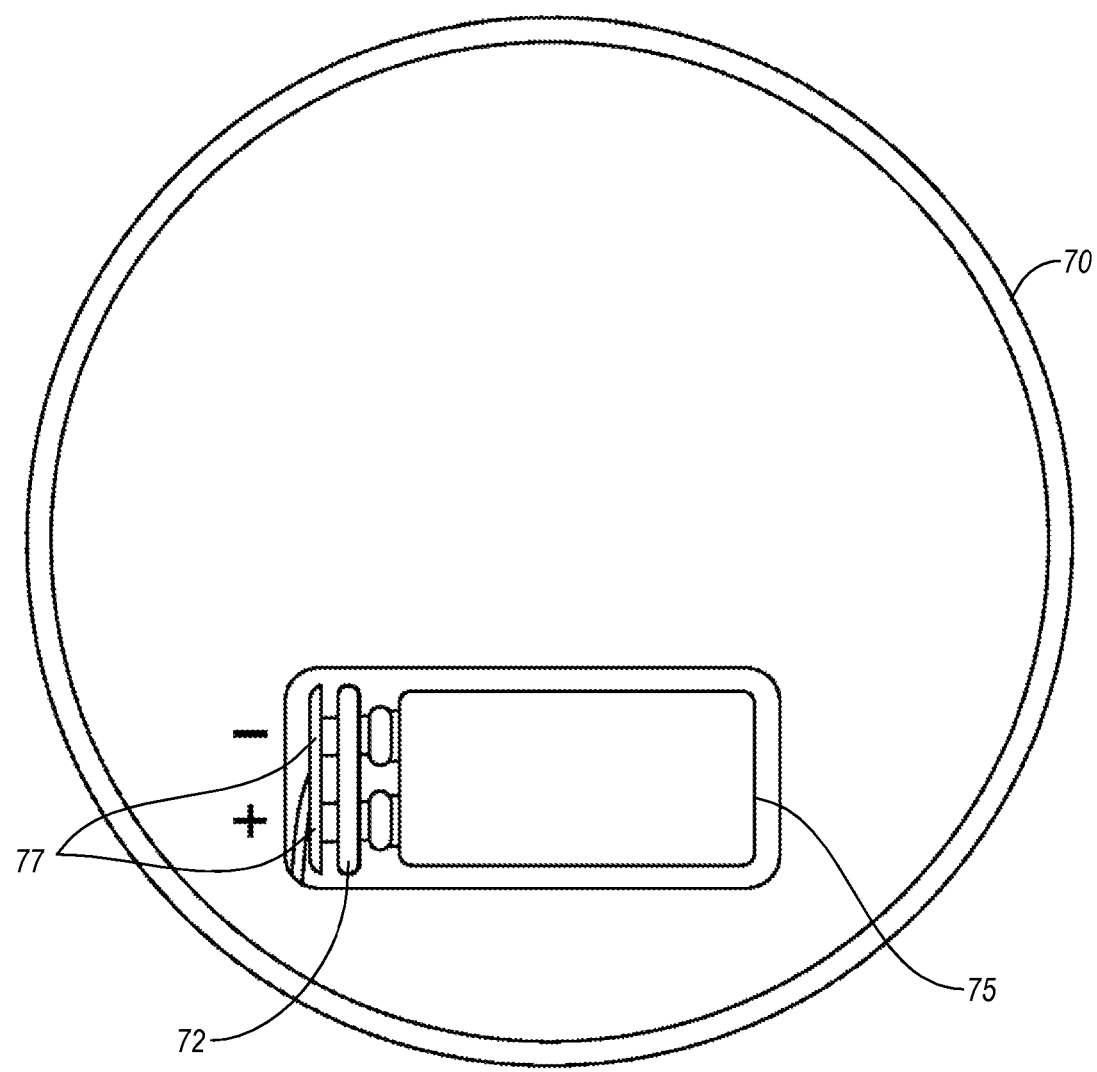
FIG. 6 shows a top view of a monitoring device that could be used in determining when a smoke alarm is sounding.

One having skill in the art will appreciate that there are numerous ways for the shut-off device 10, 50 to receive a signal from the smoke alarm, or for the shut-off device to monitor when the smoke detector is sounding. Turning to FIG. 6, there is shown one representative configuration for monitoring when the smoke alarm is sounding. FIG. 6 shows a back view of a standard smoke detector 70, with the battery cover removed. A standard smoke detector 70 may be fitted with a Hall Effect Sensor 72 or other sensors (a shunt resistor method for example) for detecting change in current. The sensor 72 is shown as a tab that is placed between the battery 75 and the contacts 77 of the smoke alarm 70. While FIG. 6 depicts a Hall Effects sensor in conjunction with a battery-powered DC alarm, one with skill in the art would appreciate that the Hall Effect Sensor could also be used in conjunction with an AC alarm.

The sensor 72 may detect changes in the current draw on the battery 75 of the smoke alarm. A Hall Effect Sensor is a transducer, which converts a magnetic field level into electrical form. Electricity carried through a conductor (such as the electricity carried through the power cord of an appliance when it is in use) produces a magnetic field that varies with current. The Hall Sensor measures the magnetic field that varies as current is drawn. When the alarm on a standard smoke detector sounds, there is an approximately twenty milliamp (20 mA) increase in current draw. This difference may be measured by the sensor 72. (The change in current draw can also be detected in a smoke alarm that is provided with A/C power). The sensor may then send a signal (or cause a signal to be sent) which is detected by the device 10, 50, thereby indicating that an alarm is sounding. This may be done in multiple different manners including RF, hard-wire, signal over existing lines, etc., and a person of ordinary skill in the art will be able to create such a communication mechanism in light of the present disclosure.

In such a manner, a conventional smoke alarm can be made to work with the shut-off device 10, 50 either by sound or by a simple add-on which allows alternate communication mechanisms to be used. Likewise, the sensor could be built into the smoke detector's alarm. One having skill in the art will appreciate that while a Hall Effect sensor or the like may be used, there are various other methods to accomplish the same end. More generally a device could be provided which detects a change in state of the smoke detector. For example, current draw may be one change in its state.

Figure 7:
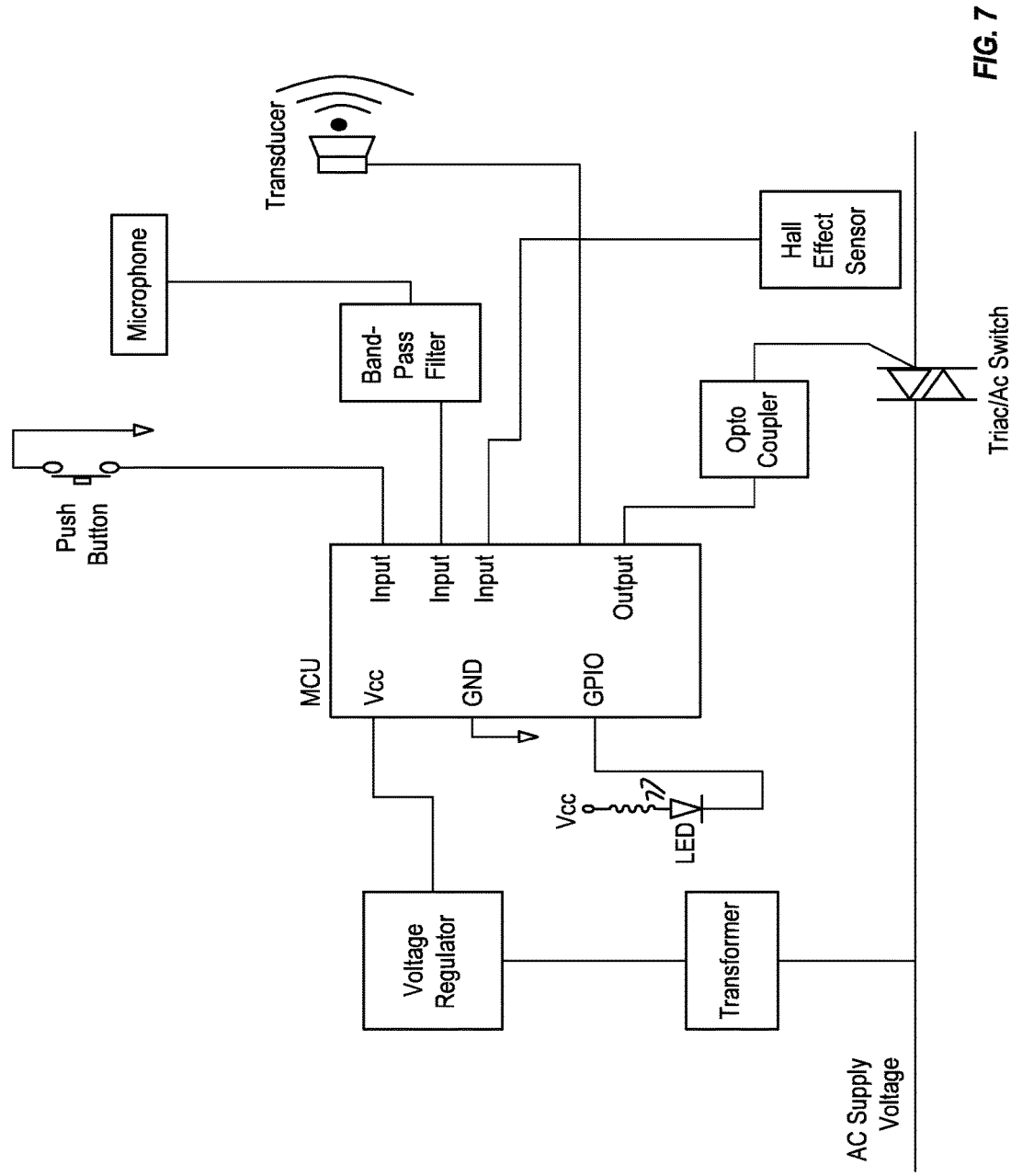
FIG. 7 shows a diagram of circuitry which could be used in accordance with one aspect of the invention.

Turning now to FIG. 7, a diagram of a circuit which could be used with the present invention is shown. This diagram is meant to be illustrative of one circuit which could be used, and those having skill in the art would appreciate that other circuits known in the art could be used. In this example circuit diagram, a microphone is connected to the input of a micro-controller (MCU in FIG. 7) through an analog band pass filter. The band-pass filter may be calibrated to common frequencies and cadences of smoke detectors, or may be synchronized (as described above, using the device's pairing button) with a particular smoke detector's frequency. In FIG. 7, the push-button represents the synchronization or pairing button. Additionally, all the hardware necessary to synchronize the device with the frequency and cadence of a particular smoke alarm may be located on the micro-controller unit.

In order to pair the shut-off device, a user may push the pairing button to put the device into synchronization mode, and then cause the particular smoke detector or device to be calibrated to sound its alarm. By way of example and not of limitation, if the device is paired to a smoke detector with a frequency of approximately 3200 Hz, the band pass filter would only accept or react to sounds with frequencies in the 3150-3250 Hz range. One having skill in the art will appreciate that the device could be paired to a different frequency, and the range could be larger than ±50 Hz, depending on the desired outcome.

The pairing button may also be programmed to restore factory settings. For example, pressing the pairing button could wipe the memory and cause the device to go into synchronization mode. Another possible way to restore factory settings could be to press the pairing button in a preprogrammed way. For example, by pressing the button three times in a quick sequence, the pairing button could restore factory settings and wipe clear any previously-programmed filter. The user could then press the pairing button while also causing a different smoke detector to sound, and thus pair the shut-off device with a different smoke detector. This could be useful when a user replaces their smoke detectors and still wishes to use the safety shut-off device.

Another possible method to pair the device, or put the device into the sync mode to allow it to pair, is to program another unique sequence to cause the device to go into sync mode. This may be beneficial in either setting up the initial sync or if new smoke detectors are desired. The specifically preprogrammed unique sequence (for example, pressing of the old smoke detector's alarm in a specific pattern, etc.) could cause the safety shut-off device to go into sync mode, and then the safety shut-off device could be synced to a new detector. Syncing could still be possible via the sync button, and this additional method would provide a no cost alternative via programming Some users may find it preferential.

To further reduce false positive alarms, in addition to filtering for a specific frequency range, the micro-controller may be programmed to time the cadence (i.e., length of time) of the sound frequency it receives. By counting the timing of the sound, the micro-controller may filter for a particular cadence. Many smoke detectors have a common cadence. By filtering for a frequency and a cadence, the device may greatly reduce the risk of false positives due to a sound from another source which has a similar frequency but a different cadence or time period.

As shown in FIG. 7, the micro-controller of the circuit may be powered by a voltage regulator. The micro-controller may have an output that triggers the gate of a switch that cuts power to the appliance. For example, the circuitry in FIG. 7 uses a TRIAC to switch the AC line off. One having skill in the art will appreciate that various methods could be used to accomplish the same means, for example, a relay, several MOSFETs, etc. A relay may be desirable in some settings because it may be less expensive and may demand less thermal management.

The micro-controller in FIG. 7 may detect signals from both the smoke detector (i.e. the sound, RF, hardwire, etc.), and a Hall Effect Sensor or other type of sensor. In such a configuration, the signals from the smoke detector may come through a microphone, through other means such as RF frequencies, Bluetooth, hard wiring, etc., or a combination to verify that the alarm is sounding. Input from a Hall Effect Sensor or other type of sensor may allow the safety shut-off device to only cut power when an appliance is in use.

The shut-off device may also be configured to only operate when the appliance is in operation. This is an improvement over prior devices, which remove current regardless of whether the appliance is in use or not. Removing the current only when the device is in use is advantageous because it makes the device more convenient for home owners. For example, if the smoke alarm is tripped early in the morning by something such as shower steam, or from candles being used during dinner, it would be inconvenient for a user to have to reset the power to the stove in order to cook at a later time. If the appliance is not on when the smoke alarm activates, then the appliance is most likely not the cause of the smoke and there is no need to turn it off. Thus, the device 10, 50 may be configured to only terminate power if the appliance is on or is drawing above a certain amount of power (i.e., the device would not shut off power merely because a clock on the range is working). This may be done by detecting current flow through the device and causing the power to be terminated if the current exceeds a desired threshold.

Because electricity carried through a conductor produces a magnetic field that varies with current, a Hall Effect sensor or other sensor (a shunt resistor method, for example) can be used to measure the current without interrupting the circuit. When the Hall Effect sensor detects current flow to the appliance, the input may be received by the micro-controller. When the micro-controller receives input from both the smoke detector and the sensor, it will produce an output that opens the AC switch, removing power from the load, if the detected current indicates that the appliance is in use. Power to the appliance could be removed through other means, such as shorting the circuit.

Figure 8:
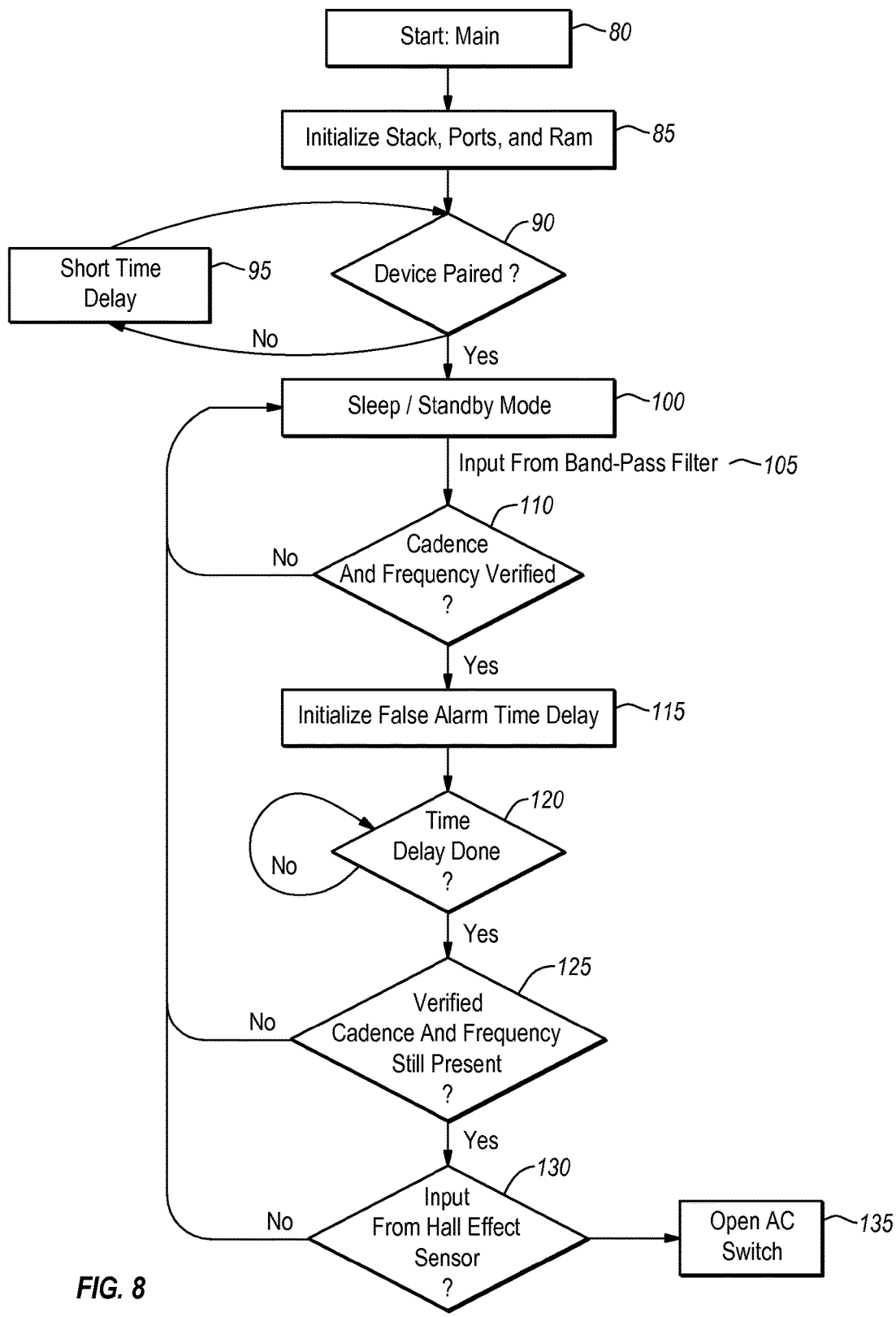
FIG. 8 shows a flow chart of a method which may be followed in accordance with principles of the present invention.

Turning now to FIG. 8, a flow chart of a logic sequence which may be followed by software of the micro-controller is shown. One of ordinary skill in the art will appreciate that there are dozens of other possible ways to accomplish this same task in software. Other methods as currently known in the state of the art would also work in accordance with the present invention, and the following description is given as merely being illustrative.

FIG. 8 shows a flow chart illustrating a method for practicing the present invention. A start 80 may be provided, as well as the necessary initializations 85. Next, the device may check for a programmed pairing or synchronization 90. While there are many methods for carrying out the logic sequences shown in FIG. 8, one representative example may include the device polling, or continuously checking to see if there is a pairing. If there is no pairing, the device may have a short time delay 95. Additionally, if there is no pairing, the device may be programmed during the short time delay 95 to flash a LED light and/or sound a short beep. This would visually/audibly allow the user to know the device was not paired.

If the device is paired, the program may continue to a sleep/standby mode 100. Any input from the band-pass filter 105 would cause the program to check for the verified frequency and cadence 110 of the input from the band-pass filter 105. If the input is not verified, the process may loop back to the standby/sleep mode 100. If the input from the band-pass filter 105 is verified, the process may continue to time delay 115. This time delay may allow occupants to fix any problems before power is cut to the load. Thus, for example, if a person leaves something on a stove and the smoke alarm goes off, the time delay may allow the person to remove the burning contents from the stove and to turn off the alarm prior to shutting off the stove. It will be appreciated that food will often smoke for a prolonged period of time before a fire actually starts. Thus, it is desirable for the time delay to be sufficiently long to allow corrective action, but not so long that it significantly increases the risk of the food, etc. igniting prior to termination of the power to the appliance. The time delay may be any reasonable amount of time, and may be around three minutes or less. Over this time period, the device may be configured to perform random and frequent signal (i.e. sound, RF, Hardwire, etc.) sampling, to reduce the number of false positive alarms.

After the time delay 120 is finished, the program will again check to see if there is a verified cadence and frequency 125 on the input port. If there is no verified input at the completion of the false alarm time delay, it may loop back to the sleep/standby mode 100. If there is a verified input, it may check for an input from the Hall Effect Sensor 130. If there is no input from the Hall Effect Sensor 130, the program may loop back to the sleep/standby mode 100. If there is an input from the Hall Effect Sensor 130, it may break the loop and turn on the output port 130, which will open an AC switch. This ends the program and the program will not be restarted until the microcontroller is disconnected and re-connected to its power source. This could potentially be accomplished by resetting the breaker associated with the outlet. Many of the prior devices must be reset manually by a button on the device, but this proves to be difficult when the device is located behind the range in the kitchen. The device may be easier and more user-friendly if it is reset by simply switching the breaker or cutting power to the device in some other way.

Figure 9:
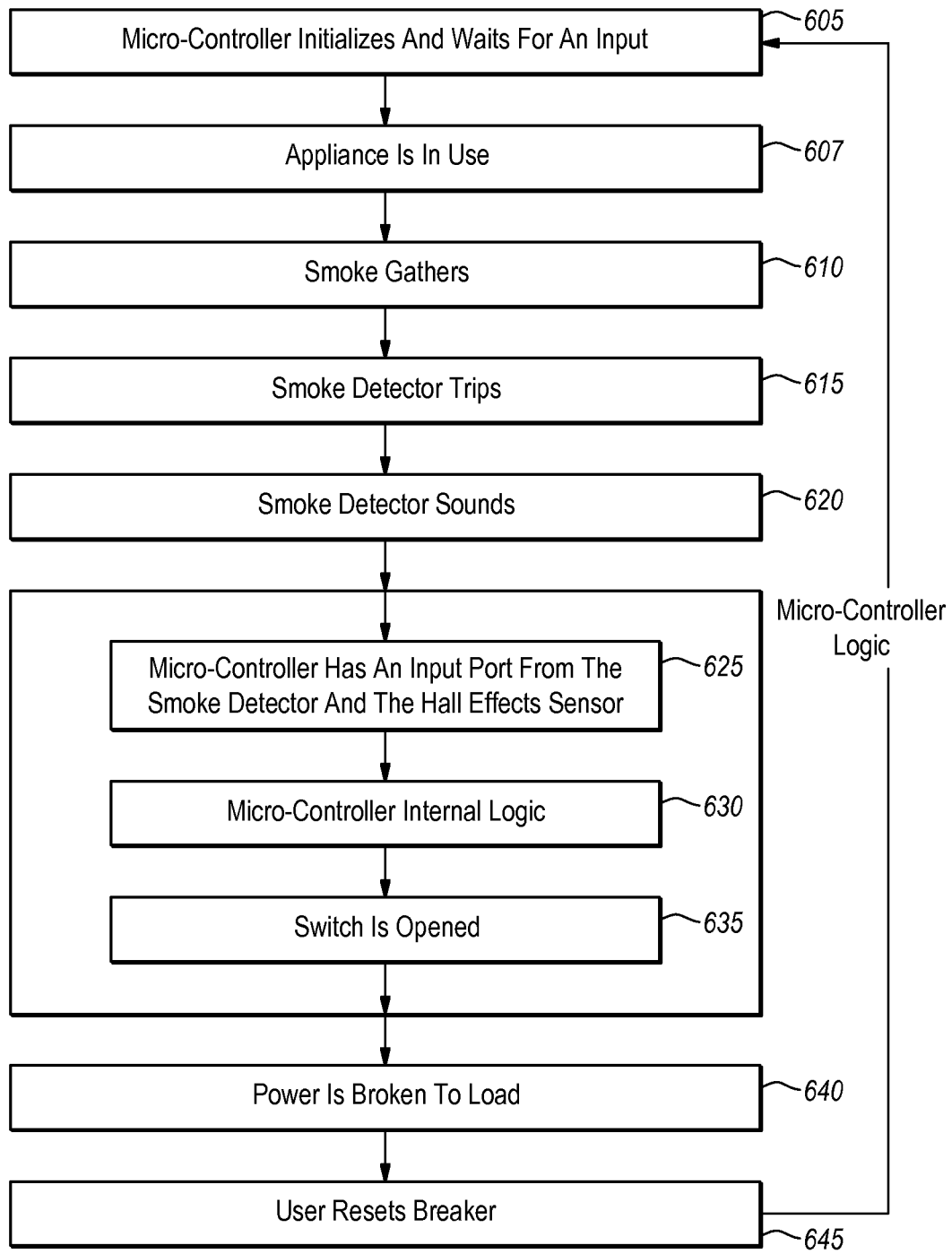
FIG. 9 shows a diagram representative of a series of events which may occur when the device of the present invention is employed.

FIG. 9 shows the logic of a series of events that may occur. The micro-controller may first start, initialize, and then loop while waiting for input from the Hall Effect Sensor 605. This may continue until the appliance is in use 607. The micro-controller may continue to loop until there is input from the smoke detector. This may continue until smoke gathers 610, tripping the smoke detector 615, which will then emit a sound 620 (or send some other signal, such as wireless, Bluetooth, wired, etc.). The microphone (or other sensor) connected to the micro-controller creates a voltage based on the sound (or other signal) passed through the band-pass filter. The micro-controller now has an input on the input port from the Hall Effect Sensor and the smoke detector 625. The micro-controller may continue its internal logic 630, and open the switch 635, which may break power to the load 640. The user may reset the device by switching the breaker 645. Allowing the device to reset by switching the breaker is more convenient than requiring a reset button on the device, because the device is often located behind the stove and is not convenient to access after installation.

Figure 10:
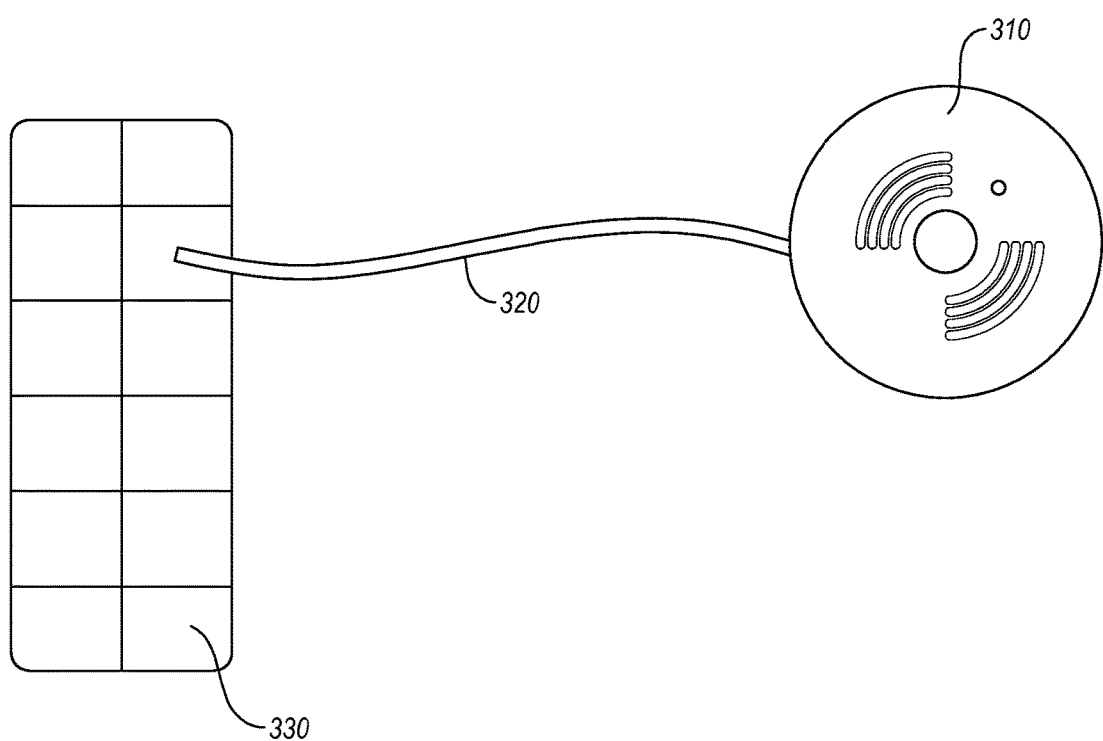
FIG. 10 shows a device made in accordance with the present invention, with a smoke alarm hard-wired to a breaker panel.

Turning now to FIG. 10, there is shown a perspective view of an alternative application of the present invention. In this embodiment, the smoke detector 310 communicates directly with the device, which is located at the circuit breaker 330. The communication may be through hard wiring 320, or through any other means known in the art, such as RF, Bluetooth. etc. An embodiment using hard wiring may be preferred, for example, in new construction. Hard wiring has an advantage of having increased fidelity over wireless communication means. Additionally, it may be preferred to shut-off power to the appliance or load at the breaker with a specialized fire prevention breaker or device rather than with the device near the appliance or load. It is appreciated that the body of the device may be placed anywhere along the power line from the breaker to the outlet that powers the appliance.

The breaker 330 may be provided with a Hall Effect Sensor or other sensor which detects current flow of the load or appliance for monitoring whether power is on or off. For example, the sensor may detect current flow, amperage, etc. Thus, if an appliance (such as a stove) is turned on and receiving power from its associated breaker, the sensor can detect this and function accordingly. The shut-off device may only shut-off breaker 330 when the sensor detects a sufficient current level to indicate the appliance/load is "on" (i.e. the range or oven is being heated as opposed to merely having a light or clock on) and a signal (i.e. Hardwire, RF, etc.) is received from the smoke detector(s).

It is advantageous to only shut-off a breaker when the appliance/load is "on" for both convenience and safety reasons. It is convenient, because if the smoke detector does go off for some reason other than a fire (like shower steam or smoke from a toaster) while the stove is not in use, the homeowner does not need to reset the breaker before using the stove. It also provides an additional safety measure, because firefighters typically check the breaker panel when they enter a home so they can potentially see where the problem was located. If a smoke alarm in the bedroom goes off while the stove is not in use, the firefighters would not want to see the stove breaker turned off as this may mislead them into believing that the stove is part of the problem.

The breaker itself may be configured to be a special type of fire prevention breaker that has the features built into it such that it can trip when a smoke detectors goes off. This specialized breaker would be similar to other specialized breakers, such as GFCI and AFCI. The breaker would include built-in features such that the breaker would trip when a smoke detector went off.

Figure 11:
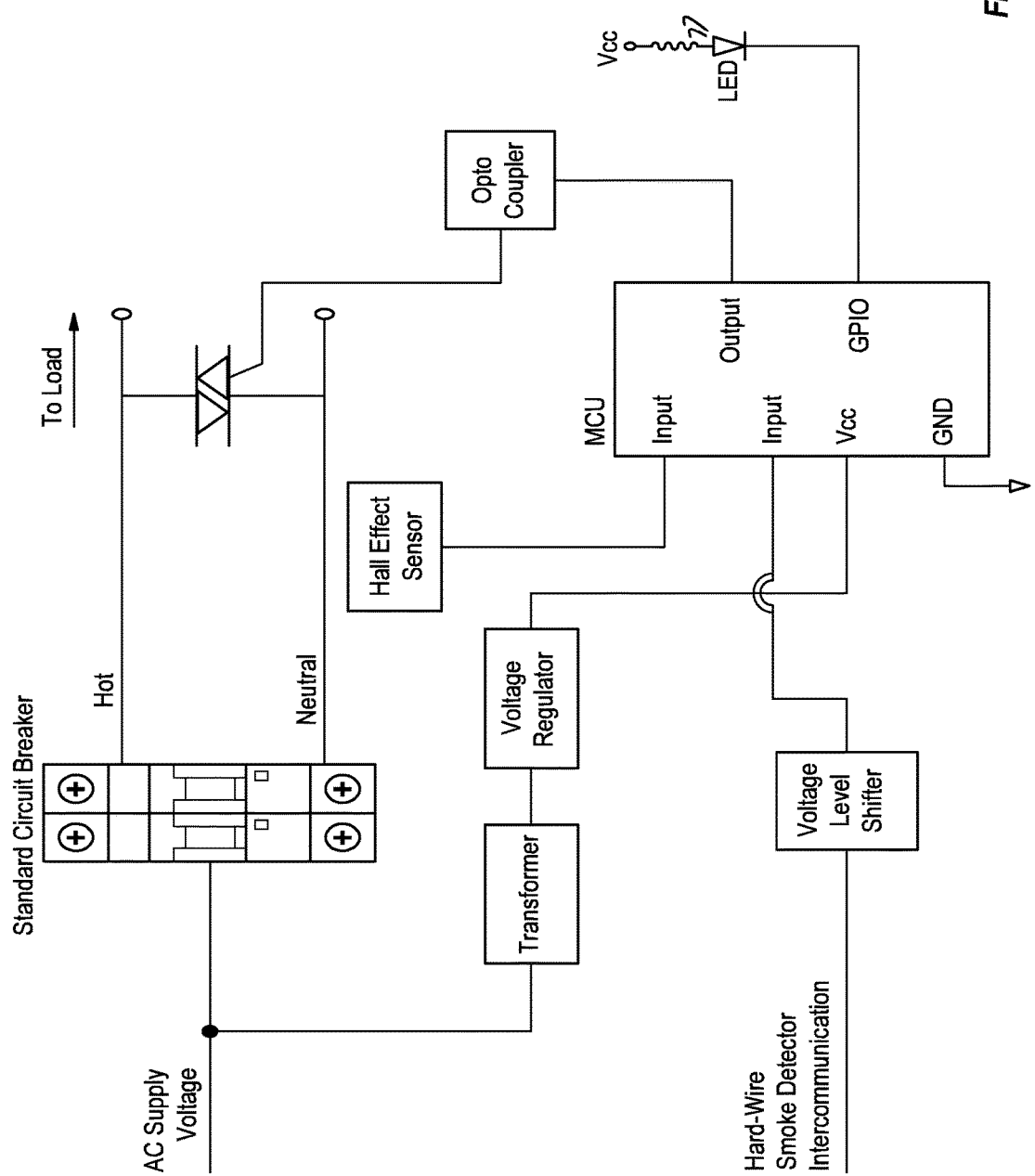
FIG. 11 shows an example of circuitry to trip a standard breaker according to the present invention.

Various methods may be used to trip, or shut-off the breaker. For example, when the smoke detector goes off, it could be configured to provide an imbalanced current to a GFCI breaker. Another method would be to rely on an induced magnetic field generated outside the GFCI breaker package to create an imbalance in the magnetic field inside the toroid of the GFCI circuit. One method that may be preferred, and is not disclosed in the prior art, is the use of shunt wired switch. A standard breaker can be tripped using a shunt wired switch, which reduces the cost and complexity of tripping the breaker. By way of example, and not limitation, FIG. 11 shows how a standard breaker may be tripped. When the circuit detects both that the smoke alarm is sounding and that the stove is on, it turns on a TRIAC that essentially shorts the circuit breaker and causes it to trip.

Another advantage of an embodiment in which the appliance or load is shut-off at the breaker is that the shut-off device may be used to shut off one breaker, multiple breakers, or all breakers associated with the breaker panel (or the main breaker). In one embodiment, the shut-off device is provided with two separate timers. The timers may be of any desirable length, but by way of example, the first timer could be around 3 minutes and the second timer could be around 15 minutes. After the smoke alarm sends a continuous signal to the shut-off device for 3 minutes (the length of the first timer), the breaker associated with the stove would be flipped. If the signal from the smoke alarm continues to be received for 15 minutes, then all breakers (or the main breaker) would be flipped. This would cut power to the entire house. This second timer would be an additional safety measure, because if cutting the power to the stove did not work, there may be a problem somewhere else in the home and it would be desirable to cut off all power.

Figure 12:
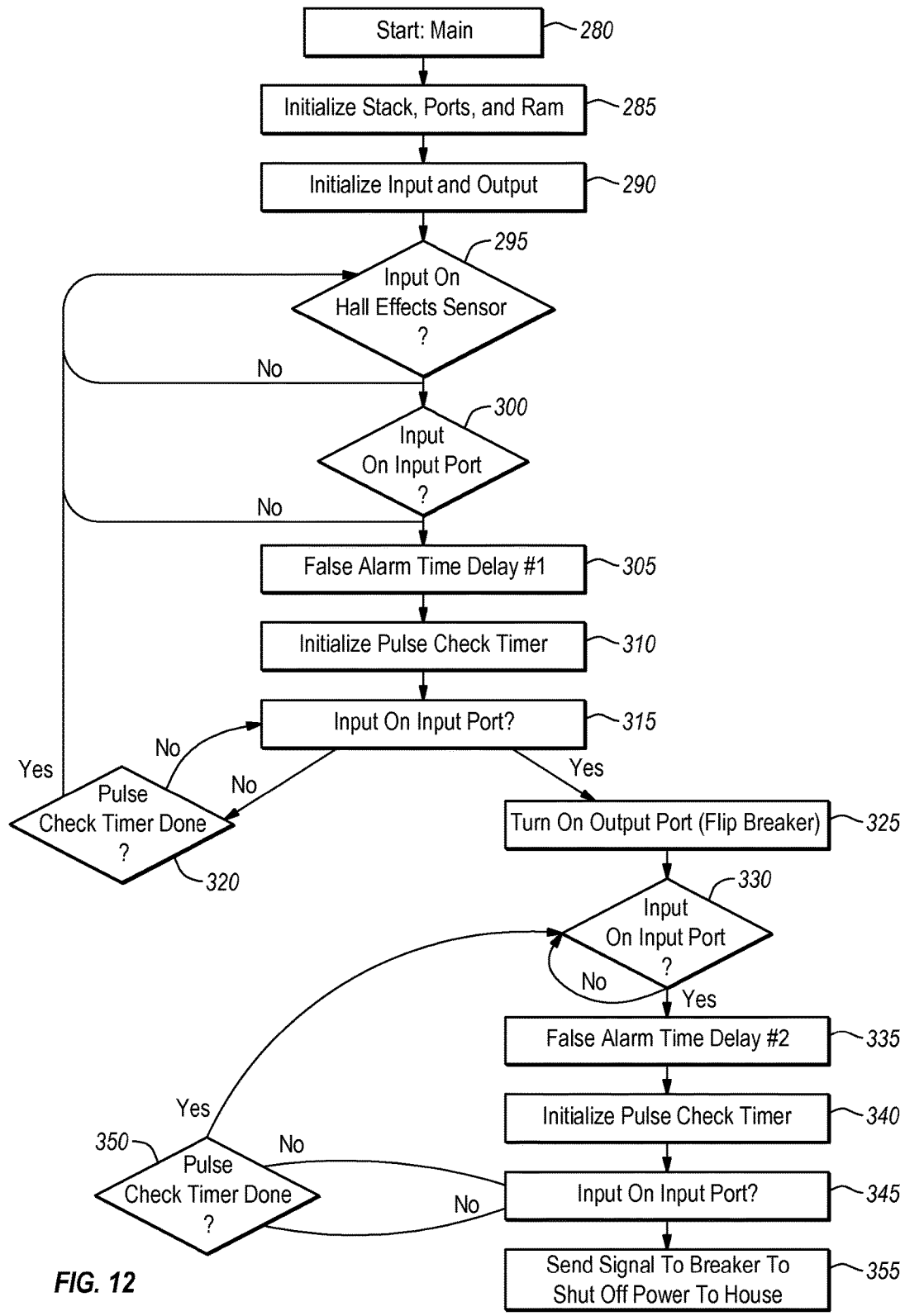
FIG. 12 shows a flow chart of logic, which may be used in conjunction with the device shown in FIG. 10.

FIG. 12 shows a possible configuration for the software or logic diagram of the safety device with two timers. The beginning of the software is similar to that shown in FIG. 8. A start 280 is provided, as well as the necessary initializations 285. Next, the input and output may be initialized 290 to calibrate which ports are designated inputs and designated outputs. The system may then poll, or continuously check to see if there is input on the Hall Effect sensor 295. If there is no input, the system (or program running thereon) may continue to poll. If there is input, the program may continue to check to see if there is input on the input port 300. If there is no input, the program may loop back to checking for input on the Hall Effect sensor 95. If there is input on the input port 300, the program may continue to the first time delay 305.

This time delay allows household members to fix any problems before power is cut to the load. This time delay may be any reasonable amount of time, and preferably around three minutes. Over this time period, the device may be configured to perform random and frequent sound sampling, to reduce the number of false positive alarms.

A pulse check timer 310 may then be initialized. This may be as long or as short as desired, but typically should be at least 5 seconds, as most smoke detectors have pauses of less than 5 seconds between sounds of the alarm. The input on the input port may then be checked 315. If there is no input, the loop 320 may continue to check for input for the duration of the pulse check timer. If there is still no input at the completion of the pulse check timer, the program may loop back to checking inputs from the Hall Effect Sensor 295. If there is an input, the program may break the loop and turn on the output port 325, which will flip the breaker.

Instead of the program ending at this point, the additional safety feature (allowing the power for the entire house to be cut in the event of a prolonged smoke detector signal) may be implemented. The micro-controller or system may again check for input on the input port form the smoke detector 330. If there is an input, a second false alarm time delay may begin 335. The time on the alarm may be any amount of time desired. In one embodiment, it may be around fifteen minutes.

A pulse check timer 340 may then be initialized. This may be as long or as short as desired, but typically should be at least 5 seconds, as most smoke detectors have pauses of less than 5 seconds between sounds of the alarm. The input on the input port may then be checked 345. If there is no input, the loop 350 may continue to check for input for the duration of the pulse check timer. If there is still no input at the completion of the pulse check timer, the program may loop back to checking inputs from the input port 330. If there is an input, it may break the loop and turn on the output port 355, which will flip the main breaker, or multiple breakers.

Additional embodiments of the current device could be used. For example, the device could use various means of communication between the smoke detector and the breaker, such as existing communication lines or wireless signals (RF, Bluetooth, etc.). The device may also employ energy efficiency measures, such as a TRIAC and optocoupler to switch AC loads.

Additionally, the device may cut power to an electric range or a gas range, in the case of a gas range a standard electronic control valve may be used to cut off the gas. This could be applied to other systems such as propane tanks, water heaters or other gas-powered apparatus. A carbon monoxide detector may also be employed as a trigger, either in place of or in addition to smoke detectors. The device may also control power flow in a system, such as a pool pump or fire sprinkler based on status of the system (or any other systems where failure of the systems to properly shut-off could lead to flooding).

In accordance with another aspect of the present invention, the device may be controlled by an alarm panel as is often installed in home automation or by alarm security companies. Protocols such as Zigbee, Zwave or the like may be employed. Additionally, the device may have ports or other methods which make the device easily compatible with such protocols as Zigbee, Zwave or the like.

In accordance with another aspect of the present invention, communication from the smoke detector to the device may be accomplished by using a module similar to what is used in the alarm security industry to notify them that a smoke detector has gone off. Once it is known that a smoke detector is activated, that information may be transmitted to the device according to the present invention through any number of ways previously mentioned (i.e. RF, Zwave, Zigbee, sound, hardwire, minivolt signal, etc.).

In accordance with another aspect of the present invention, communication from the smoke detector to the device may be accomplished by providing a specialized smoke detector to be placed appropriately which then communicates with the shutoff device. Communication from a smoke detector to the device may be accomplished by providing a specialized smoke detector to be plugged into a nearby outlet which then communicates with the shutoff device.

In accordance with another aspect of the present invention, the device may be reset by providing a separate module, which communicates with the shutoff device via any of the methods previously mentioned (i.e. RF, Zwave, Zigbee, sound, hardwire, minivolt signal, etc.) to reset it. This separate module may be placed conveniently near the stove or wherever the user deems convenient.

According to another aspect of the invention, a mobile phone may be used in communication with the device. The device may be provided, for example, with a WiFi chip. For example, the device may be programmed to send a text message to phone alerting the user that the stove has been on for a certain amount of time (i.e., after 2 hours of continuous on, the device sends a text message to the mobile phone). Additionally, the phone may have an application that can be used to send a signal to the device to shut-off power to a load.

In one embodiment, an integrated safety shut-off system for controlling power supply is provided. The integrated shut-off system includes a power route for providing power from an electrical system to an appliance. For example, in FIG. 11, the power route may include the AC supply voltage, the transformer, and the voltage regulator, through the microcontroller (MCU) and circuit breaker and on to the load, In this embodiment, the integrated safety shut-off system is integrated within the appliance. That is, the component parts of the integrated safety shut-off system are located within the appliance. Thus, if the integrated safety shut-off system were installed in a stove, oven, microwave, refrigerator, washer, dryer or other appliance, the integrated safety shut-off system would be located somewhere within the stove, oven, microwave, etc. The integrated safety shut-off system would be connected to the power route or power supply for the appliance, such that power from a wall outlet or other source would travel through the integrated safety shut-off system before reaching at least a portion of the appliance's powered components.

The integrated safety shut-off system further includes an alarm sensor for detecting an alarm signal from a particular smoke alarm. The alarm signal may include both a frequency component and a cadence component, where the cadence component comprises a specified series of tones emitted in a specific pattern with pauses of specific lengths between each tone. The alarm sensor may be further configured to send an input to a micro-controller based on the detected alarm signal. The integrated safety shut-off system also includes a current sensor that determines whether current is being drawn by a load (such as an appliance component) when the load is connected to the integrated safety shut-off system. The current sensor may, for example, detect that current is being drawn by a heating element in an oven, or by a motor in a dryer or washer. The current sensor may also be configured to detect smaller amounts of current such as that drawn by a clock or display interface.

Continuing this embodiment, the integrated safety shut-off system includes a switch mechanism for terminating power supply along the power route to the appliance. The switch mechanism may be any type of electrically or mechanically operated switch that allows current to flow to appliance components or prevents current from flowing to appliance components. The switch may allow or prevent current to all appliance components or only to select components, depending on how the switch is positioned within the appliance's power route. The integrated safety shut-off system further includes a synchronization module that allows users to synchronize the particular smoke alarm with the alarm sensor of the safety shut-off system. As shown in FIG. 1, a pairing button 21 may be included on the device itself or on the appliance in which the integrated safety shut-off system is integrated. At least in some embodiments, the synchronization includes synchronizing the alarm sensor with both the frequency component and the cadence component of the smoke alarm's signal, such that only alarm signals from the particular smoke alarm will trigger a power supply termination. The micro-controller may be disposed in communication with the alarm sensor, the current sensor, and the switch mechanism for determining that the frequency component and the cadence component of the alarm signal match the previously synchronized alarm signal from the particular smoke alarm, and may further terminate power supply in response to the input from the alarm sensor while the load is drawing current above a predetermined threshold.

In some embodiments, the power route may include an input power line that conducts power from a power outlet to the integrated safety shut-off system. As shown in FIG. 11, the input AC power line conducts power from a power source such as an outlet to the micro-controller which can cut power to the appliance upon making a determination that power is to be cut. The power route may further include an output power line that conducts power from the integrated safety shut-off system to the appliance. The micro-controller may interact with a switch to cut power to the appliance motor, heating element or other load. In some cases, the micro-controller may implement a time delay that delays activation of the switch mechanism for a predetermined amount of time. Thus, even in cases where the micro-controller determines that power is to be cut, the time delay may prevent power from being cut. This may prevent power from being cut unnecessarily, such as in cases of a false alarm.

The integrated safety shut-off system may further include a communication means that allows communication between the integrated safety shut-off system and a remote device. This remote device may be any type of mobile or stationary electronic device including a cell phone, laptop, tablet, wearable device, cloud computing system, alarm panel or other type of computing system. The integrated safety shut-off system may communicate with the electronic device using any of a variety of different wired or wireless means including wired or wireless network cards, WiFi radios, Bluetooth radios, Z-Wave, Zigbee or any other communication means. The electronic device may be owned by the owner of the appliance or may be a device owned by a management company that monitors apartment complexes, condos, homes, or otherwise monitors appliances.

The integrated safety shut-off system may be configured to take power readings over a specified period of time and determine a baseline power reading that is implemented to filter out noise in the power route. These baseline readings may establish which power readings are to be interpreted as normal power signal and which are to be discarded as mere power signal noise. These readings may enable the integrated safety shut-off system to filter out power spikes and other false indicators of a load on the power route. If the integrated safety shut-off system is ever actuated cuts power to the load, the integrated safety shut-off system may be reset by cycling a breaker switch that is connected to the power route. Thus, instead of having to manually push a reset button on the integrated safety shut-off system (which may be inaccessibly integrated within an appliance or may be placed in a hard-to-reach location), the user may simply cycle the breaker that is connected to the power route for that appliance and the integrated safety shut-off system will be reset. Once reset, the integrated safety shut-off system will assume normal operation, and will be listening for an alarm signal.

In some embodiments, power supply to a load may be terminated upon detecting an alarm signal (e.g. from a smoke alarm), determining that the load is drawing current above a predetermined threshold, and subsequently detecting the alarm signal. Thus, if the integrated safety shut-off system detects a signal initially, it may not immediately cut power to the load. Rather, it may determine that current is being drawn by the appliance and then go back into a listening state. If the integrated safety shut-off system again determines that the alarm signal is still sounding, then integrated safety shut-off system will cut power to the load. Still further, power supply to a load may be terminated upon detecting one cadence of the alarm signal, determining that the load is drawing current above a predetermined threshold, and subsequently detecting another cadence of the alarm signal. Then, if the integrated safety shut-off system detects the first cadence, determines that current is being drawn, and detects the cadence again (or detects a different cadence that would trigger a power cut), power will be cut to the appliance. In this manner, the number of times power is cut to an appliance due to a false alarm may be reduced.

Another embodiment describes a safety shut-off system for cutting power to a load. The system includes a smoke detector that has a transmission member for communicating an alarm signal. The safety shut-off system includes a home security system that has a receiving member for receiving an alarm signal from the smoke detector. In some embodiments, the alarm signal may include both a frequency component and a cadence component, where the cadence component has a specified series of tones emitted in a specific pattern with pauses of specific lengths between each tone. In other embodiment, the alarm signal may be a radio frequency signal such as a Z-wave signal. The home security system receives and acknowledges the alarm signal, and further implements a transmission member for relaying an electrical signal. Next, the safety shut-off system includes a synchronization module that allows users to synchronize the particular smoke detector with an alarm sensor of the safety shut-off system. As mentioned above, the synchronization may include synchronizing the alarm sensor with both the frequency component and the cadence component of the smoke alarm's signal, so that only alarm signals from the particular smoke detector will trigger a power supply termination. The general location of the smoke alarm (or at least the distance to the smoke alarm) may be determined during synchronization, and may be used to indicate that the safety shut-off device is in range of the smoke alarm.

The safety shut-off device further includes a shut-off switch having a receiving member for receiving a signal from the home security system. The shut-off switch is configured to cut power to a load when a signal from the home security system is received, when a current sensor detects that the load is currently receiving power, and when it is determined that the frequency component and the cadence component of the alarm signal match the previously synchronized alarm signal from the particular smoke detector. The signal received from the home security system may be a wired or wireless signal. In cases where the signal received from the home security system is a wireless signal, the wireless signal may be a Z-wave signal. Thus, the smoke detector may communicate directly with a home security or home automation system, and the home security or home automation system may communicate (via a wired or wireless communication) with the safety shut-off device which cuts power to the load. As described above, the home security system may implement a delay or may wait for a certain number of alarm cycles or cadences before indicating to the safety shut-off device that it is to cut power to the load.

Other embodiments include a system for terminating electrical power to an appliance. The system includes a housing having an electrical route therethrough for passing power from a building electrical system to an appliance. The system further includes an alarm sensor configured for receiving an alarm signal from a particular smoke detector. The alarm signal includes both a frequency component and a cadence component, where the cadence component has a specified series of tones emitted in a specific pattern with pauses of specific lengths between each tone. The system further includes a synchronization program for allowing the alarm sensor to be synchronized to the alarm signal. The synchronization includes synchronizing the alarm sensor with both the frequency component and the cadence component of the smoke detector's alarm signal, so that only alarm signals from the particular smoke detector will trigger a power supply termination. The synchronization program is further configured to provide at least one indication that the synchronization with the alarm signal was successful. The system also includes a switch mechanism for selectively terminating power flow through the electrical route in response to a signal indicating that the alarm sensor has detected an alarm signal from the particular smoke detector. The signal indicates that the alarm sensor has detected an alarm signal from the smoke detector being generated upon determining that the frequency component and the cadence component of the alarm signal match the previously synchronized alarm signal from the particular smoke detector.

In some embodiments, the synchronization program may cause an audible tone to be emitted from the system in a specified pattern until synchronization with the alarm signal is successful. The audible tone emitted from the system indicates that the system is within range of the alarm signal. The synchronization program may also cause a visible signal to be emitted from the system in a specified pattern until synchronization with the alarm signal is successful. Thus, as a user is attempting to synchronize a safety shut-off device with a smoke alarm, the user may be notified via the audible tone and/or the visible signal (e.g. a flashing LED light) that the safety shut-off device is within range of the smoke alarm and that the safety shut-off device is compatible with the smoke alarm. In some cases, the synchronization program may cause a second, different visible signal to be emitted from the safety shut-off system in a specified pattern once synchronization with the alarm signal has completed. In this manner, the user may be notified that synchronization was successful and that the safety shut-off device was successfully paired to the smoke alarm. In some embodiments, the safety shut-off device may be configured to communicate a readout message on the appliance itself, indicating that pairing of the integrated safety shut-off device was successful.

There is thus disclosed a device and method for shutting off appliances and the like in the event of a fire. It will be appreciated that numerous changes may be made to the present invention without departing from the scope of the claims.

We claim:

1. An integrated safety shut-off system for controlling power supply, the shut-off system comprising:
   a power route for providing power from an electrical system to an appliance, the integrated safety shut-off system being integrated within the appliance;
   an alarm sensor for detecting an alarm signal from a particular smoke alarm, the alarm signal including both a frequency component and a cadence component, the cadence component comprising a specified series of tones emitted in a specific pattern with pauses of specific lengths between each tone, and further sending an input to a micro-controller based on the detected alarm signal;
   a current sensor to determine whether current is being drawn by a load when the load is connected to the integrated safety shut-off system;
   a switch mechanism for terminating power supply along the power route to the appliance;
   a synchronization module that allows users to synchronize the particular smoke alarm with the alarm sensor of the safety shut-off system, the synchronization including synchronizing the alarm sensor with both the frequency component and the cadence component of the smoke alarm's signal, such that only alarm signals from the particular smoke alarm will trigger a power supply termination; and
   the micro-controller disposed in communication with the alarm sensor, the current sensor, and the switch mechanism for determining that the frequency component and the cadence component of the alarm signal match the previously synchronized alarm signal from the particular smoke alarm and terminating power supply in response to the input from the alarm sensor while the load is drawing current above a predetermined threshold.

2. The integrated safety shut-off system of claim 1, wherein the integrated safety shut-off system is integrated within an electric stove.

3. The integrated safety shut-off system of claim 1, wherein the power route includes an input power line that conducts power from a power outlet to the integrated safety shut-off system.

4. The integrated safety shut-off system of claim 1, wherein the power route includes an output power line that conducts power from the integrated safety shut-off system to the appliance.

5. The integrated safety shut-off system of claim 1, further comprising a time delay for delaying activation of the switch mechanism for a predetermined amount of time.

6. The integrated safety shut-off system of claim 1, wherein the integrated safety shut-off system further comprises a communication means that allows communication between the integrated safety shut-off system and a remote device.

7. The integrated safety shut-off system of claim 6, wherein the remote device comprises an electronic mobile device associated with the owner of the appliance.

8. The integrated safety shut-off system of claim 1, wherein the integrated safety shut-off system is configured to take one or more power readings over a specified period of time and determine a baseline power reading that is implemented to filter out noise in the power route.

9. The integrated safety shut-off system of claim 1, wherein the integrated safety shut-off system is resettable by cycling a breaker switch that is connected to the power route.

10. The integrated safety shut-off system of claim 1, wherein power supply to the load is terminated upon detecting the alarm signal, determining that the load is drawing current above a predetermined threshold, and subsequently detecting the alarm signal.

11. The integrated safety shut-off system of claim 1, wherein power supply to the load is terminated upon detecting a first specified cadence of the alarm signal, determining that the load is drawing current above a predetermined threshold, and subsequently detecting a second specified cadence of the alarm signal.

12. A safety shut-off system for cutting power to a load, the system comprising a smoke detector, the smoke detector having a transmission member for communicating an alarm signal;
 a home security system, the home security system having a receiving member for receiving an alarm signal from the smoke detector, the alarm signal including both a frequency component and a cadence component, the cadence component comprising a specified series of tones emitted in a specific pattern with pauses of specific lengths between each tone, the home security system further comprising a transmission member for relaying an electrical signal;
 a synchronization module that allows users to synchronize the particular smoke detector with an alarm sensor of the safety shut-off system, the synchronization including synchronizing the alarm sensor with both the frequency component and the cadence component of the smoke alarm's signal, such that only alarm signals from the particular smoke detector will trigger a power supply termination; and
 a shut-off switch having a receiving member for receiving a signal from the home security system, the shut-off switch configured to cut power to the load when a signal from the home security system is received, when a current sensor detects that the load is currently receiving power, and when it is determined that the frequency component and the cadence component of the alarm signal match the previously synchronized alarm signal from the particular smoke detector.

13. The safety shut-off system of claim 12, wherein the signal received from the home security system comprises a wireless signal.

14. The safety shut-off system of claim 13, wherein the wireless signal comprises Z-wave signal.

15. The safety shut-off system of claim 12, wherein the signal received from the home security system comprises a wired signal.

16. A system for terminating electrical power to an appliance, the system comprising:
 a housing having an electrical route therethrough for passing power from a building electrical system to an appliance;
 an alarm sensor configured for receiving an alarm signal from a particular smoke detector, the alarm signal including both a frequency component and a cadence component, the cadence component comprising a specified series of tones emitted in a specific pattern with pauses of specific lengths between each tone;
 a synchronization program for allowing the alarm sensor to be synchronized to the alarm signal, the synchronization including synchronizing the alarm sensor with both the frequency component and the cadence component of the smoke detector's alarm signal, such that only alarm signals from the particular smoke detector will trigger a power supply termination, the synchronization program being further configured to provide at least one indication that the synchronization with the alarm signal was successful; and
 a switch mechanism for selectively terminating power flow through the electrical route in response to a signal indicating that the alarm sensor has detected an alarm signal from the particular smoke detector, the signal indicating that the alarm sensor has detected an alarm signal from the smoke detector being generated upon determining that the frequency component and the cadence component of the alarm signal match the previously synchronized alarm signal from the particular smoke detector.

17. The system of claim 16, wherein the synchronization program causes an audible tone to be emitted from the system in a specified pattern until synchronization with the alarm signal is successful.

18. The system of claim 17, wherein the audible tone emitted from the system indicates that the system is within range of the alarm signal.

19. The system of claim 16, wherein the synchronization program causes a visible signal to be emitted from the system in a specified pattern until synchronization with the alarm signal is successful.

20. The system of claim 19, wherein the synchronization program causes a second, different visible signal to be emitted from the system in a specified pattern once synchronization with the alarm signal has completed.

* * * * *